United States Patent
Willis

(10) Patent No.: US 6,590,447 B1
(45) Date of Patent: Jul. 8, 2003

(54) PRECISION BRIDGE AMPLIFIER

(75) Inventor: Scott C. Willis, Manassas, VA (US)

(73) Assignee: Bae Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 10/115,562

(22) Filed: Apr. 2, 2002

(51) Int. Cl.[7] .................................................. H03F 1/36
(52) U.S. Cl. ....................... 330/84; 330/124 R; 330/146
(58) Field of Search ............................. 330/69, 84, 85, 330/124 R, 146, 147

(56) References Cited

U.S. PATENT DOCUMENTS

| | | | |
|---|---|---|---|
| 2,761,019 A | * 8/1956 | Hall | ............................ 179/171 |
| 3,808,545 A | 4/1974 | Stanley | |
| 4,206,416 A | * 6/1980 | Kellogg | ........................ 330/69 |
| 4,229,692 A | 10/1980 | Graeme | |
| 4,596,957 A | * 6/1986 | Fukaya et al. | ............... 330/252 |
| 5,075,634 A | 12/1991 | French | |
| 5,621,352 A | 4/1997 | Botti et al. | |
| 6,023,193 A | 2/2000 | Ierymenko | |
| 6,107,886 A | 8/2000 | Kusakabe et al. | |

OTHER PUBLICATIONS

Apex Microtechnology Corporation, "Bridge Mode Operation of Power Operational Amplifiers," Application Note 20, 4 pages, (Feb. 2001).

* cited by examiner

Primary Examiner—Henry Choe
(74) Attorney, Agent, or Firm—Dicke, Billig & Czaja, PLLC

(57) ABSTRACT

A bridge amplifier includes a first input node connectable to a power source having an input voltage, a second input node connectable to a control source having a control voltage, and a first and a second output node. A first amplifier module having a gain is coupled between the first and second input nodes and between the first and second output nodes, and a second amplifier module is coupled to the first input node and between the first and second output nodes. The first amplifier module compares a voltage differential between the first and second output nodes to the control voltage and provides an output voltage at the first output node necessary to maintain the voltage differential at a level substantially equal to a product of the control voltage multiplied by the gain. The second amplifier module compares a midpoint voltage level of the input voltage to a midpoint voltage level of the voltage differential and provides and output voltage at the second output node necessary to maintain the voltage differential midpoint level at a level substantially equal to the input voltage midpoint level.

20 Claims, 4 Drawing Sheets

PRECISION BRIDGE AMPLIFIER

THE FIELD OF THE INVENTION

The present invention relates generally to amplifiers, and more particularly to a precision bridge amplifier having two single-ended amplifiers.

BACKGROUND OF THE INVENTION

Amplifiers can be employed to amplify electronic signals of small magnitudes to produce corresponding electronic signals having larger magnitudes. Amplifiers are accordingly used in electronic systems in a variety of applications where it is beneficial to control large loads with small signals. A particular type of amplifier configuration is a bridge amplifier. A typical bridge amplifier includes two single-ended power amplifiers that are driven out of phase. By connecting a load across the outputs of the two amplifiers, the available peak voltage to the load is double that which would otherwise be available from one single-ended amplifier. Bridge amplifiers are useful in applications where the supply voltage is limited and in applications where single-ended amplifiers are operating near their maximum voltage ratings.

Conventional bridge amplifiers utilize a master-slave configuration, wherein one of the single-ended power amplifiers functions as a master amplifier and has a gain of a given magnitude to provide an amplified control signal at its output. The second of the single-ended power amplifies functions as a slave amplifier having a unity gain and simply inverts the output of the master amplifier. Using this approach, ideally the available peak voltage differential across the outputs of the master-slave amplifiers will be twice that available solely from the master amplifier. In practical applications, however, distortion/infidelity can easily be created in the output waveform throughout the frequency range, as a result of the feedback control loops for the master and slave amplifiers sensing only their associated single-ended output voltage and the gain/offset mismatch between the two amplifiers. Distortions are not desirable in applications where the associated load is highly voltage sensitive and demands a high level of control over the voltage waveform.

In view of the above, there is a desire for a bridge amplifier that reduces distortion/infidelity in the output waveform.

SUMMARY OF THE INVENTION

One aspect of the present invention provides a precision bridge amplifier including a first input node connectable to a power source having an input voltage, a second input node connectable to a control source having a control voltage, and a first and second output node. A first amplifier module is coupled between the first and second input nodes and between the first and second output nodes, and has a gain. A second amplifier module is coupled to the first input node and between the first and second output nodes. The first amplifier module compares a voltage differential between the first and second output nodes to the control voltage, and provides an output voltage at the first output node necessary to maintain the voltage differential at a level substantially equal to a product of the control voltage multiplied by the gain. The second amplifier module determines a midpoint voltage level of the input voltage and a midpoint voltage level of the voltage differential, and provides an output voltage at the second output node necessary to maintain the voltage differential midpoint level at a level substantially equal to the input voltage midpoint level.

In one embodiment, the first amplifier module includes an error amplifier circuit coupled to the second input node. A power amplifier circuit is coupled to the first input node, to a ground node, and between the error amplifier circuit and the first output node. A feedback circuit is coupled to the error amplifier circuit, to the ground node, and between the first and second output nodes.

In one embodiment, the error amplifier circuit of the first module comprises an operational amplifier having a non-inverting terminal coupled to the second input node, an inverting terminal, a positive voltage terminal, a negative voltage terminal, and an output terminal coupled to the power amplifier circuit. A first resistor is coupled between the inverting terminal and the feedback circuit. A second resistor has a first terminal coupled to the inverting terminal and a second terminal. A capacitor is coupled between the output terminal and the second terminal of the second transistor.

In one embodiment, the power amplifier circuit of the first module comprises an inverting power amplifier having an input terminal coupled to the error amplifier circuit output terminal, a positive voltage terminal coupled to the first input node, a negative voltage terminal coupled to the ground node, and an output terminal coupled to the first output node.

In one embodiment, the feedback circuit of the first module comprises an operational amplifier having a non-inverting terminal, an inverting terminal, a positive voltage terminal, a negative voltage terminal, and an output terminal coupled to the error amplifier circuit. A first resistor is coupled between the inverting terminal and the first output node, and a second resistor is coupled in parallel with the first resistor. A third resistor is coupled between the non-inverting terminal and the second output node, and a fourth resistor is coupled in parallel with the third resistor. A fifth resistor is coupled between the inverting terminal and the output terminal, and sixth resistor is coupled between the non-inverting terminal and the ground node. In one embodiment, the first, second, third and fourth resistors have substantially equal values, and the fifth and sixth resistors have substantially equal values.

In one embodiment, the second amplifier module includes an error amplifier circuit coupled to a ground node. A power amplifier circuit is coupled to the first input node, to the ground node, and between the error amplifier circuit and the second output node. A feedback circuit is coupled to the first input node, the error amplifier circuit, to the ground node, and between the first and second output nodes.

In one embodiment, the error amplifier circuit of the second module includes an operational amplifier having a non-inverting terminal coupled to the ground node, an inverting terminal, a positive voltage terminal, a negative voltage terminal, and an output terminal coupled to the power amplifier circuit. A first resistor is coupled between the inverting terminal and the feedback circuit. A second resistor has a first terminal coupled to the inverting terminal and has a second terminal. A capacitor is coupled between the output terminal and the second terminal of the second resistor.

In one embodiment, the power amplifier circuit of the second module comprises and inverting power amplifier having an input terminal coupled to the error amplifier circuit output terminal, a positive voltage terminal coupled to the first input node, a negative voltage terminal coupled to the ground node, and an output terminal coupled to the second output node.

In one embodiment, the feedback circuit of the second module includes an operational amplifier having a non-inverting terminal, an inverting terminal, a positive voltage terminal, a negative voltage terminal, and an output terminal coupled to the error amplifier circuit. A first resistor is coupled between the inverting terminal and the second output node. A second resistor is coupled between the inverting terminal and the first output node, and has a value equal to the first resistor. A third resistor is coupled between the non-inverting terminal and the first input node. A fourth resistor is coupled between the non-inverting terminal and the ground node, and has a value substantially equal to the third resistor. A fifth resistor is coupled between the inverting terminal and the output terminal, and a sixth resistor is coupled between the non-inverting terminal and the ground node. In one embodiment, the first, second, third and fourth resistors have substantially equal values, and the fifth and sixth resistors have substantially equal values.

In one embodiment, the first and second amplifier modules have passive components having substantially equal values. In one embodiment, the first and second amplifier modules having active components having substantially equal values. In one embodiment, the first and second amplifier modules have both active and passive components having substantially equal values.

In one embodiment, the first amplifier module is substantially identical to the second amplifier module. In one embodiment, the first and second amplifier modules each include external input and external output terminals, wherein the external input and external output terminals of the first amplifier module are coupled into the bridge amplifier differently than the external input and external output terminals of the second amplifier module. In one embodiment, the first and second amplifier modules are each encapsulated in plastic with access only to the external input and external output terminals.

One aspect the present invention provides a method of providing a desired voltage differential between a first node and a second node. The method includes receiving an input voltage with a midpoint voltage level from a power source and a control voltage from a control source. The method includes providing a voltage differential between the first node and the second node. The voltage differential between the first and second nodes is compared to the control voltage, and a voltage level necessary to maintain the voltage differential at a level substantially equal to the desired voltage level is provided at the first node. The desired voltage level is substantially equal to the control voltage multiplied by a gain. A midpoint level of the voltage differential between the first and second nodes is compared to the power source midpoint voltage level and a voltage level necessary to maintain the midpoint voltage level of the voltage differential at a level substantially equal to the power source midpoint voltage level is provided at the second node.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the claims.

Figure 1:
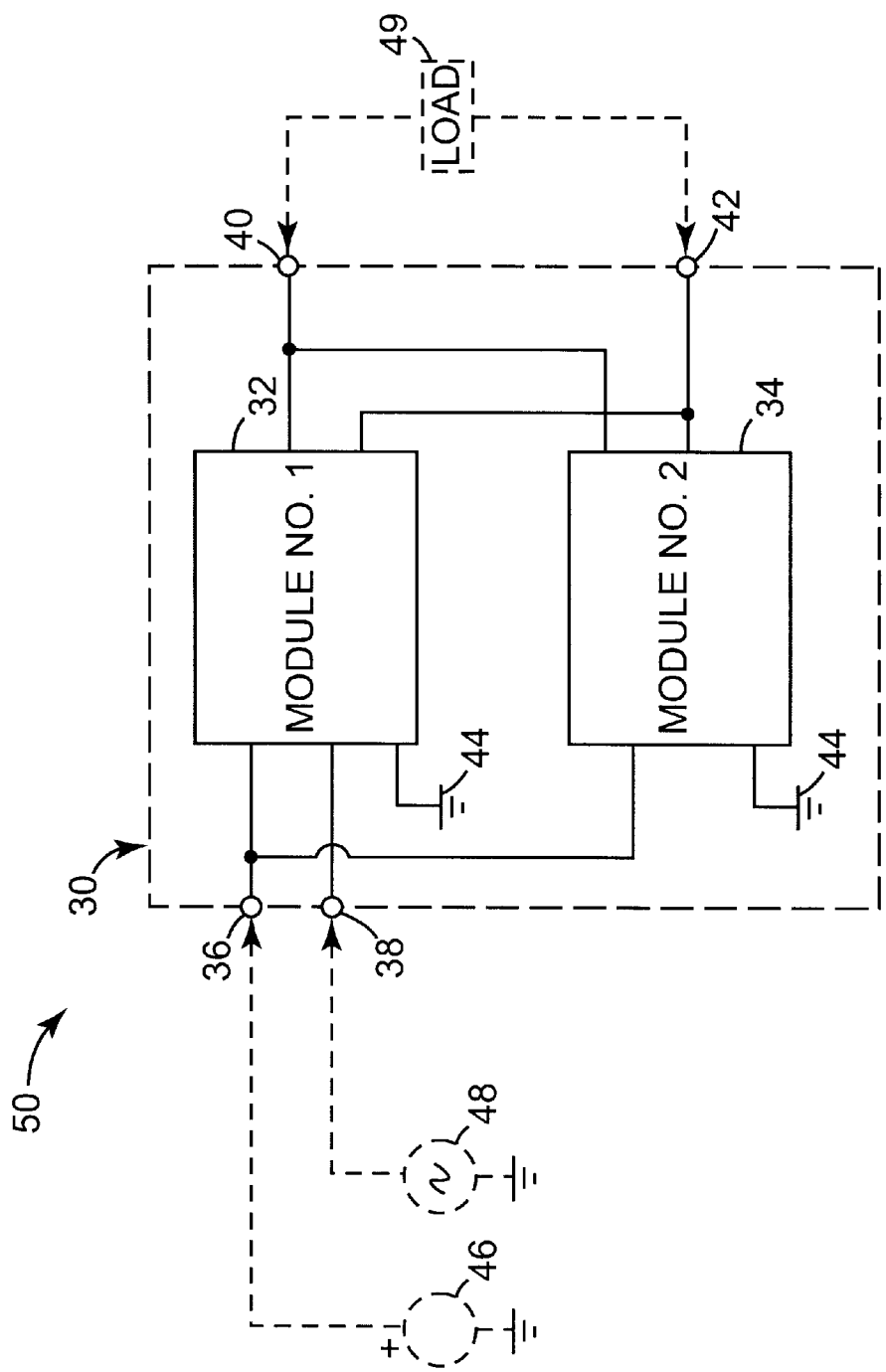
FIG. 1 is a block diagram of one embodiment of a power source having a precision bridge amplifier according to the present invention and a corresponding power supply and control source.

One embodiment of a power source having a precision bridge amplifier 30 according to the present invention is illustrated generally at 50 in FIG. 1. Bridge amplifier 30 comprises a first amplifier module 32, a second amplifier module 34, a first input node 36, a second input node 38, a first output node 40, a second output node 42, and a ground node 44. Bridge amplifier 30 is connectable at input node 36 to a DC DC power supply 46 having an input voltage, and is connectable at input node 38 to a control source 48 having a control voltage.

In one embodiment, precision bridge amplifier 30 is designed to provide a voltage differential between output node 42 and output node 40 that is substantially equal to a desired voltage differential, wherein the desired voltage differential is equal to a product of the control voltage of control source 48 multiplied by a fixed gain provided by first amplifier module 32. Thus, as the control voltage varies, bridge amplifier 30 correspondingly varies the voltage differential. Precision bridge amplifier is further designed to maintain a midpoint voltage level of the voltage differential at a level substantially equal to a midpoint voltage level of the input voltage of DC power supply 46. Bridge amplifier 30 supplies the voltage differential to a load 49 coupled between output nodes 40 and 42. In example embodiments, load 49 can be any load requiring a precisely controlled voltage level for operation, including but not limited to, a piezoelectric transducer used for micro-positioning, wherein a displacement produced by the transducer is proportional to its supply voltage. Together, precision bridge amplifier 30, DC power supply 46, and control source 48 form power source 50 for providing a controllable voltage differential to load 49.

First amplifier module 32 is coupled between first and second input nodes 36 and 38, between first and second output nodes 40 and 42, and to a ground node 44. First amplifier module 32 compares the voltage differential across load 49 coupled between output nodes 42 and 40 to the control voltage at second input node 38, and provides an output voltage at output node 40 necessary to maintain the voltage differential at a level substantially equal to the desired voltage differential. Second amplifier module 34 determines a midpoint voltage level of the input voltage and a midpoint voltage level of the voltage differential and provides an output voltage at output node 42 necessary to maintain the midpoint voltage level of the voltage differential at a level substantially equal to the input voltage midpoint level.

Figure 2:
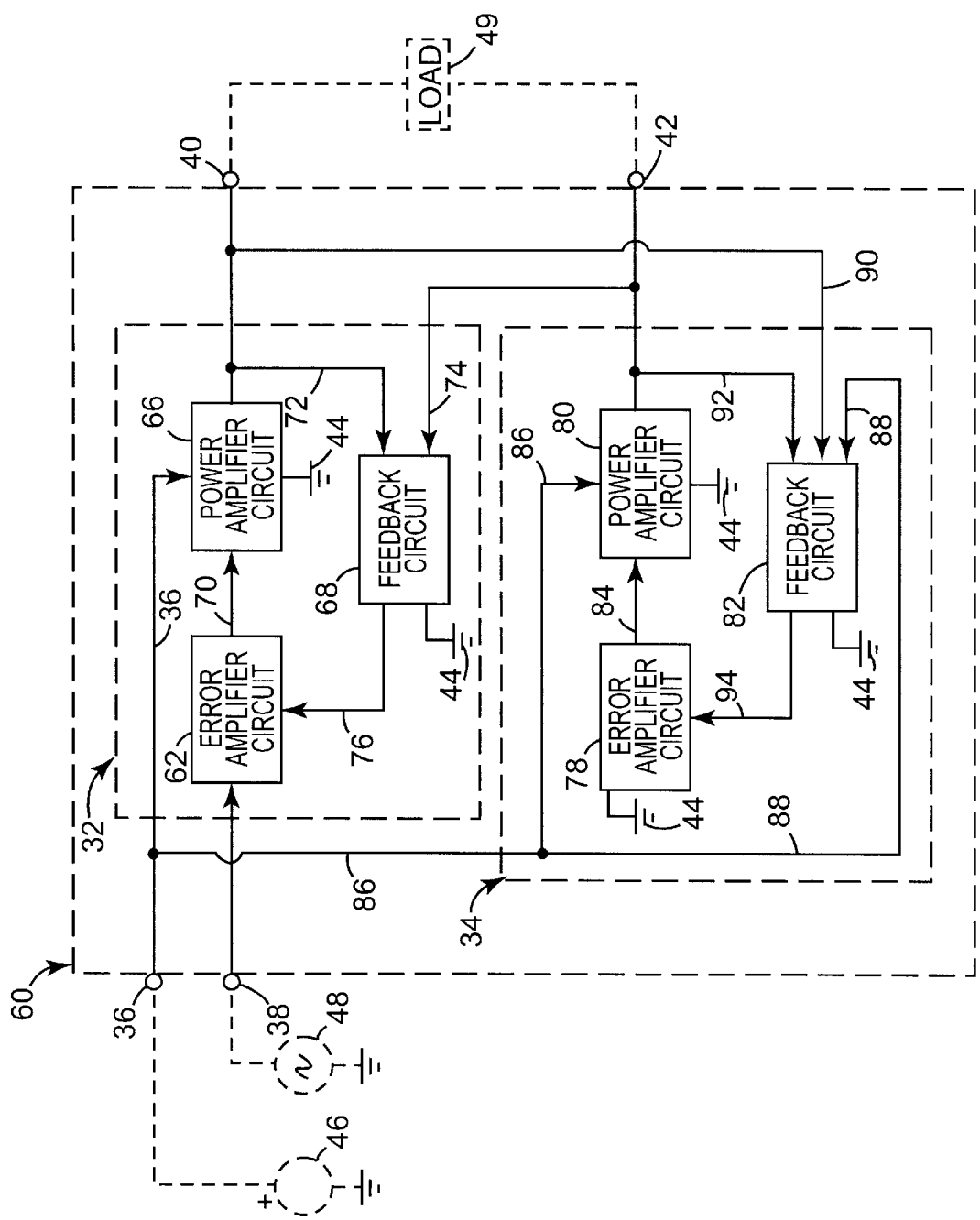
FIG. 2 is a block diagram of one embodiment of the precision bridge amplifier of FIG. 1.

One embodiment of a precision bridge amplifier according to the present invention is illustrated in block diagram form at 60 in FIG. 2, and is configured and coupled as described below. First amplifier module 32 comprises an error amplifier circuit 62, a power amplifier circuit 64, and a feedback circuit 66. Error amplifier circuit 62 is coupled to second input node 38 and to power amplifier circuit 66 via a line 70. Power amplifier circuit 66 is coupled between first input node 36, to ground node 44, and to first output node 40. Feedback circuit 68 is coupled to ground node 44, between first and second output nodes 40 and 42 via lines 72 and 74, respectively, and via a line 76 to error amplifier 62. Together, error amplifier circuit 62 and power amplifier circuit 66 provide a fixed gain for precision bridge amplifier 60.

Second amplifier module 34 comprises an error amplifier circuit 78, a power amplifier circuit 80, and a feedback circuit 82. Error amplifier circuit 78 is coupled to ground node 40 and to power amplifier circuit 80 via a line 84. Power amplifier circuit 80 is coupled between first input node 36 via a line 86 and ground node 44, and to second output node 42. Feedback circuit 82 is coupled to ground node 44, to first input node 36 via a line 88, between first and second output nodes 42 and 44 via lines 90 and 92, respectively, and to error amplifier circuit 78 via a line 94.

First amplifier module 32 operates to provide a voltage differential between output nodes 40 and 42 that is substantially equal to a desired voltage differential, wherein the desired voltage differential is equal to the product of the fixed gain and the control voltage at input node 38. Second amplifier module 34 operates to maintain the voltage differential midpoint level at a level substantially equal to the midpoint level of the input voltage at input node 36.

Feedback circuit 68 measures the voltage differential between output nodes 42 and 40 via lines 72 and 74 and provides a feedback voltage that is substantially equal to the voltage differential divided by the fixed gain to error amplifier circuit 62. Error amplifier circuit 62 compares the feedback voltage from the control voltage at node 38 and provides an error voltage to power amplifier circuit 66 via line 70. Power amplifier circuit 66 amplifies the error voltage to adjust the output voltage level at output node 40 to thereby adjust the voltage differential to more closely equal the desired voltage differential.

The amount power amplifier circuit 66 adjusts the output voltage level at node 40 is proportional to the amount the voltage differential between output nodes 42 and 40 differs from the desired voltage differential. If the voltage differential is substantially equal to the desired voltage differential, the error voltage will be minimal and power amplifier circuit 66 will only slightly adjust the output voltage level at output node 40. However, if the voltage differential differs greatly from the desired voltage differential, the error voltage will be more significant and power amplifier circuit will more greatly adjust the output voltage at output node 40.

Feedback circuit 82 measures the voltage differential between nodes 42 and 40 via lines 92 and 90 and the input voltage at node 36 via line 88, and determines the midpoint voltage level of each. Feedback circuit 82 provides a feedback voltage that is proportional to difference between the input and differential midpoint levels to error amplifier circuit 78 via line 94. Error amplifier circuit 78 references the feedback voltage to ground and provides an error voltage that is proportional to the feedback voltage to power amplifier circuit 80 via line 84. Power amplifier circuit 66 amplifies the error voltage to thereby adjust the output voltage level at output node 42 to thereby adjust the voltage differential midpoint level to more closely equal the input voltage midpoint level.

The amount power amplifier circuit 80 adjusts the output voltage level at node 42 is proportional to the amount the voltage differential midpoint level differs from the input voltage midpoint level. If the voltage differential midpoint level is substantially equal to the input voltage midpoint level, the error voltage will be minimal and power amplifier circuit 80 will only slightly adjust the output voltage level at output node 42. However, if the voltage differential midpoint level differs greatly from the input voltage midpoint level, the error voltage will be more significant and power amplifier circuit 80 will more greatly adjust the output voltage at output node 42.

One embodiment of a precision bridge amplifier according to the present invention is illustrated schematically at 100 in FIG. 3, and is configured and coupled as described below. First amplifier module 32 comprises error amplifier circuit 62, power amplifier circuit 66, and feedback circuit 68. Error amplifier circuit 62 further includes an operational amplifier 102 having a non-inverting terminal 104 coupled to second input node 38, an inverting terminal 106, an output terminal 108, a positive voltage terminal 110, and a negative voltage terminal 112. Operational amplifier 102 is configured to operate as an inverting error amplifier. A resistor 114 is has a first terminal coupled to inverting terminal 106 and a second terminal 116. A resistor 118 is has a first terminal coupled to inverting terminal 106 and a second terminal. A capacitor 120 is coupled between the second terminal of resistor 118 and output terminal 108. Resistors 144 and 118, and capacitor 120 are frequency and gain components for operational amplifier 162.

Power amplifier circuit 66 comprises an inverting power amplifier 122 having an input terminal 124 coupled to output terminal 108 of operational amplifier 102, an output terminal 126 coupled to first output node 40, a voltage terminal 128 coupled to first input node 36, and a ground terminal 130 coupled to ground node 44. Together, error amplifier circuit 62 and power amplifier circuit 66 provide precision bridge amplifier 60 with a fixed gain.

Feedback circuit 68 further includes an operational amplifier 132 having a non-inverting terminal 134, an inverting terminal 136, an output terminal 138, a positive voltage terminal 140, and a negative voltage terminal 142. Operational amplifier 132 is configured to operate as an inverting differential amplifier. A resistor 144 is coupled between inverting terminal 136 and first output node 40, and a resistor 146 is coupled in parallel with resistor 144. A resistor 148 is coupled between non-inverting terminal 134 and second output node 40, and a resistor 150 is coupled in parallel with resistor 148. A resistor 152 is coupled between inverting terminal 132 and output terminal 138, and a resistor 154 is coupled between non-inverting terminal 134 and ground node 44. Output terminal 138 is coupled to the second terminal 116 of resistor 114 via a line 156. Resistors 144, 146, 148, 150, 152 and 154 set up the gain of operation amplifier 132 and scale down the high voltage differential across load 49 to a voltage level suitable for the low voltage amplifier electronics of error amplifier circuit 62 and power amplifier circuit 66. The gain of operational amplifier 132 is substantially equal to the inverse of the fixed gain provided by error amplifier circuit 62 and power amplifier circuit 66. Resistors 146 and 150 also serve to equalize the Thevenin impedance of first amplifier module 32 with the Thevenin impedance of second amplifier module 34.

Second amplifier module 34 comprises error amplifier circuit 78, power amplifier circuit 80, and feedback circuit 82. Error amplifier circuit 78 further includes an operational amplifier 162 having a non-inverting terminal 164 coupled to ground node 44, and inverting terminal 166, and output terminal 168, a positive voltage terminal 170, and a negative voltage terminal 172. Operational amplifier 162 is configured to operate as an inverting error amplifier. A resistor 174 is has a first terminal coupled to inverting terminal 166 and a second terminal 176. A resistor 178 is has a first terminal coupled to inverting terminal 166 and a second terminal. A capacitor 180 is coupled between the second terminal of resistor 178 and output terminal 168. Resistors 174 and 178, and capacitor 180 are frequency and gain components for operational amplifier 162.

Power amplifier circuit 80 comprises an inverting power amplifier 182 having an input terminal 184 coupled to output terminal 168 of operational amplifier 162, an output terminal 186 coupled to second output node 42, a voltage terminal 188 coupled to first input node 36 via a line 189, and a ground terminal 190 coupled to ground node 44.

Feedback circuit 82 further includes an operational amplifier 192 having a non-inverting terminal 194, an inverting terminal 196, an output terminal 198, a positive voltage terminal 200, and a negative voltage terminal 202. Operational amplifier 192 is configured to operate as an inverting differential amplifier. A resistor 204 is coupled between inverting terminal 196 and first output node 40, and a resistor 206 is coupled in between inverting terminal 196 and second output node 42. A resistor 208 is coupled between non-inverting terminal 194 and first input node 36 via a line 195, and a resistor 210 is coupled between non-inverting terminal 194 and ground node 44. A resistor 212 is coupled between inverting terminal 192 and output terminal 198, and a resistor 214 is coupled between non-inverting terminal 194 and ground node 44. Output terminal 198 is coupled to the second terminal 176 of resistor 174 via a line 216. Resistors 204, 206, 208, 210, 212 and 214 set up the gain of operation amplifier 192 and scale down the high voltages to a voltage level suitable for the low voltage amplifier electronics of error amplifier circuit 78 and power amplifier circuit 80. Resistors 204, 206, 208 and 210 are of equal value. Resistors 204 and 206 form a voltage divider and provide the midpoint voltage level of the voltage differential across load 49 as an input to inverting terminal 196. Resistors 208 and 210 also form a voltage divider and provide the midpoint level of input voltage source 46 as an input to non-inverting terminal 194.

Positive voltage terminals 110, 140, 170 and 200, and negative voltage terminals 112, 142, 172 and 200 of operational amplifiers 102, 132, 162 and 192, respectively, are connectable to low-voltage power supplies that are not shown.

In one embodiment, while configured slightly differently, the active and passive components of first module 32 and second module 34 have substantially equal values. Resistors 144, 146, 148, 150, 204, 206, 208 and 210 have substantially equal values, resistors 152, 154, 212 and 214 have substantially equal values, resistors 114 and 174 have substantially equal values, resistors 118 and 178 have substantially equal values, and capacitors 120 and 180 have substantially equal values. Operational amplifiers 102, 122 and 132 are substantially equal to operational amplifiers 162, 182, and 192, respectively. By utilizing active and passive components that are substantially equal in value, gain and offset mismatch between first module 32 and second module 34 is minimized, thus reducing distortion/infidelity in the voltage differential waveform provided by precision bridge amplifier 100 between output nodes 42 and 40.

An illustrative example below describes the operation of precision bridge amplifier 100. In the example, input voltage source 46 provides a level of 100 volts at first input node 38, and bridge amplifier 100 provides a gain of 10. Thus, if control source 48 has a value of +1 volts at second input node 38 in a first instance and −1 volts in a second instance, the desired voltage differential between output nodes 42 and 40 is +10 volts and −10 volts, respectively.

When control source 48 provides a control voltage level at first input node 38 of 0 volts, the desired voltage differential between nodes 42 and 40 is also 0 volts. In this instance, precision bridge amplifier 100 to provides voltage levels at output nodes 42 and 40 that are substantially equal. In this case, with the voltage level at first input node 36 of 100 volts, first amplifier module 32 and second amplifier module 34 provide an output of 50 volts at output nodes 40 and 42, respectively. Thus, the voltage differential between output nodes 42 and 40 is 0 volts. With the control voltage at 0 volts and precision bridge amplifier at steady state, there will be substantially no voltage differential between the inverting and non-inverting terminal of operational amplifiers 102, 122, 162 and 192.

When control source 48 provides a control voltage level at first input node 38 of +1 volts, for instance, the desired voltage differential between output nodes 42 and 40 is 10 volts. Precision bridge amplifier 100 utilizes a dynamic process between first amplifier module 32 and second amplifier module 34 to provide the desired voltage differential and to center the voltage differential at the midpoint input voltage source 46, in this case 50 volts.

When the control voltage at input node 38 begins to change from 0 volts to +1 volts, output node 42 and output node 48 will each have a voltage level substantially equal to 50 volts. Operational amplifier 132 is configured as a differential amplifier and measures the voltage differential across load 49 by subtracting the voltage level at inverting terminal 136 from the voltage level at non-inverting terminal 134. The associated resistors of feedback circuit 68 are configured provide operational amplifier 132 with gain substantially equal to the inverse of the gain provided by bridge amplifier 100. In other words, feedback circuit 68 operates to scale down the differential voltage between nodes 42 and 40 to thereby provide a feedback voltage at output terminal 138 that is substantially equal to the voltage differential across load 49 divided by the gain bridge amplifier 100. Resistors 144, 146, 148 and 150 also function to reduce the higher voltage levels at nodes 40 and 42 to a level compatible with operational amplifier 132. Resistors 146 and 148, in addition to reducing voltage levels, serve to maintain substantially the same Thevenin impedance between the first module 32 and the sedond module 34. Here, since both output node 42 and output node 40 are at 50 volts, the difference is substantially 0 volts, and the feedback voltage provided at output terminal 138 is also at substantially 0 volts.

Error amplifier circuit 62 receives the feedback voltage from feedback circuit 68 via line 156. Operational amplifier 102 operates as an error amplifier and senses the difference, or error, between the control voltage and the feedback voltage by subtracting the voltage at inverting terminal 106 from the voltage at non-inverting terminal 104. Resistors 116 and 118, and capacitor 120 serve as frequency compensation and gain components for operational amplifier 102. As the control voltage begins to change from 0 volts to +1 volts, and with a feedback voltage of 0 volts, the voltage differential between non-inverting terminal 104 and inverting terminal 106 begins to increase, resulting in operational amplifier 102 increasing the error voltage at output terminal 108.

Power amplifier 122 receives the error voltage from error amplifier circuit 62 at input terminal 124. In this instance, the increase in the error voltage at input terminal 124 results in inverting power amplifier 122 decreasing the output voltage at output terminal 126, and consequently decreasing the output voltage level at output node 40.

Operational amplifier 192 is configured as a differential amplifier and measures the difference between the midpoint level of input voltage source 36 and the midpoint voltage level of the voltage differential between output nodes 42 and 40 by subtracting the voltage level at inverting terminal 136 from the voltage level at non-inverting terminal 134. Resistors 204 and 206 function as voltage dividers to provide at inverting terminal 196 the midpoint voltage level of the differential voltage between nodes 42 and 40. Resistors 208 and 210 serve as voltage dividers to provide at non-inverting terminal 194 the midpoint level of input voltage source 36. In the illustrative example, as inverting power amplifier 122 reduces the voltage level at output node 40, the voltage level at inverting terminal 196 begins to decrease from 50 volts, which was the midpoint voltage level of the voltage differential between output nodes 42 and 40 when the control voltage was at 0 volts, resulting in a corresponding decrease in the voltage level at inverting terminal 196. The voltage level at non-inverting terminal is substantially constant and substantially equal to the midpoint level of input source 36, in this instance, 50 volts. As the voltage at inverting terminal 196 decreases, the voltage differential between non-inverting terminal 194 and inverting terminal 196 increases, resulting in operational amplifier 182 increasing the feedback voltage level at output terminal 198.

Error amplifier circuit 78 receives the feedback voltage from feedback circuit 82 via line 216. Operational amplifier 162 functions as an error amplifier and senses the difference, or error, between the ground reference and the feedback voltage by subtracting the voltage at inverting terminal 166 from the ground reference at non-inverting terminal 164. Resistors 176 and 178, and capacitor 180 serve as frequency compensation and gain components for operational amplifier 162. As the feedback voltage at inverting terminal 166 increases, the voltage differential between non-inverting terminal 164 and inverting terminal 166 also increases, resulting in operational amplifier 162 decreasing the error voltage at output terminal 168.

Power amplifier 182 receives the error voltage from error amplifier circuit 162 at input terminal 184. In this instance, the decrease in the error voltage at input terminal 184 results in inverting power amplifier 182 increasing the output voltage at output terminal 186, and consequently increasing the output voltage level at output node 42.

Precision bridge amplifier 100 continues this dynamic process until the feedback voltage level provided by feedback circuit 68 at inverting terminal 106 of operational amplifier 102 is substantially equal to the control voltage level of +1 volts at non-inverting terminal 104. When this occurs, the voltage differential across load 49 between output nodes 42 and 40 will be substantially equal to the desired level of 10 volts, with power amplifier 182 providing an output voltage level at node 42 substantially equal to 55 volts, and power amplifier 122 providing an output voltage level at node 40 substantially equal to 45 volts. Thus, the midpoint voltage level of the voltage differential between output nodes 42 and 40 will be substantially equal to 50 volts, or substantially equal to the midpoint level of the input voltage source 46. By maintaining the midpoint level of the voltage differential between nodes 42 and 40 at the midpoint level of the input voltage source, precision bridge amplifier operates in the center of its range.

In another instance, when control source 48 has a value of −1 volts, precision bridge amplifier 100 function as described above to provide a voltage differential across load 49 between output nodes 42 and 40 of −10 volts. However, in this instance, the output voltage level at output node 42 will be substantially equal to 45 volts, while the output voltage at node 40 will be substantially equal to 55 volts. The midpoint voltage level of the voltage differential between output nodes 42 and 40 will again be substantially equal to 50 volts. In the illustrative example, precision bridge amplifier is capable of providing differential voltage level between output nodes 42 and 40 having a maximum range between −100 volts and +100 volts.

Figure 3:
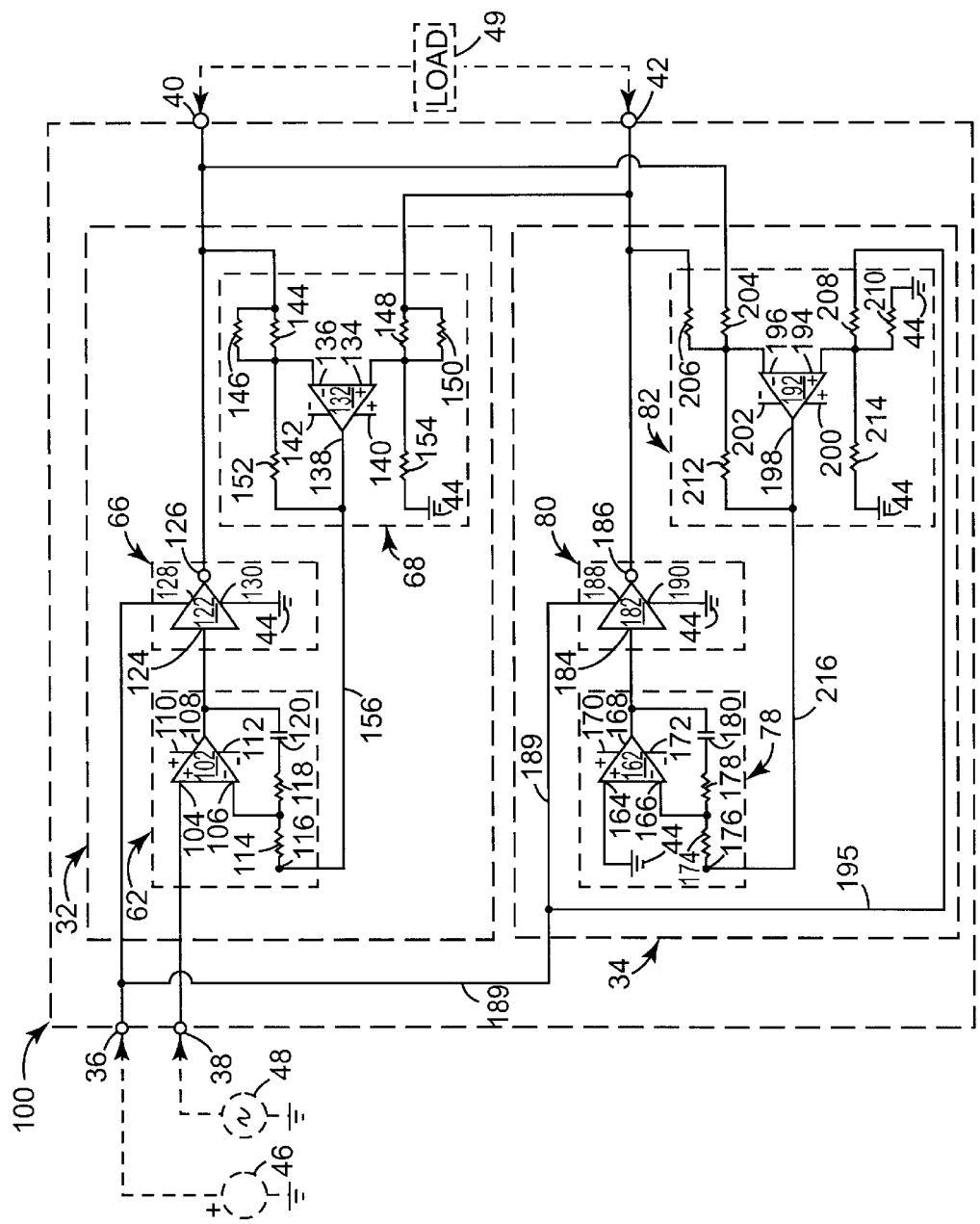
FIG. 3 is a schematic diagram of one embodiment of the precision bridge amplifier of FIG. 2.
Figure 4:
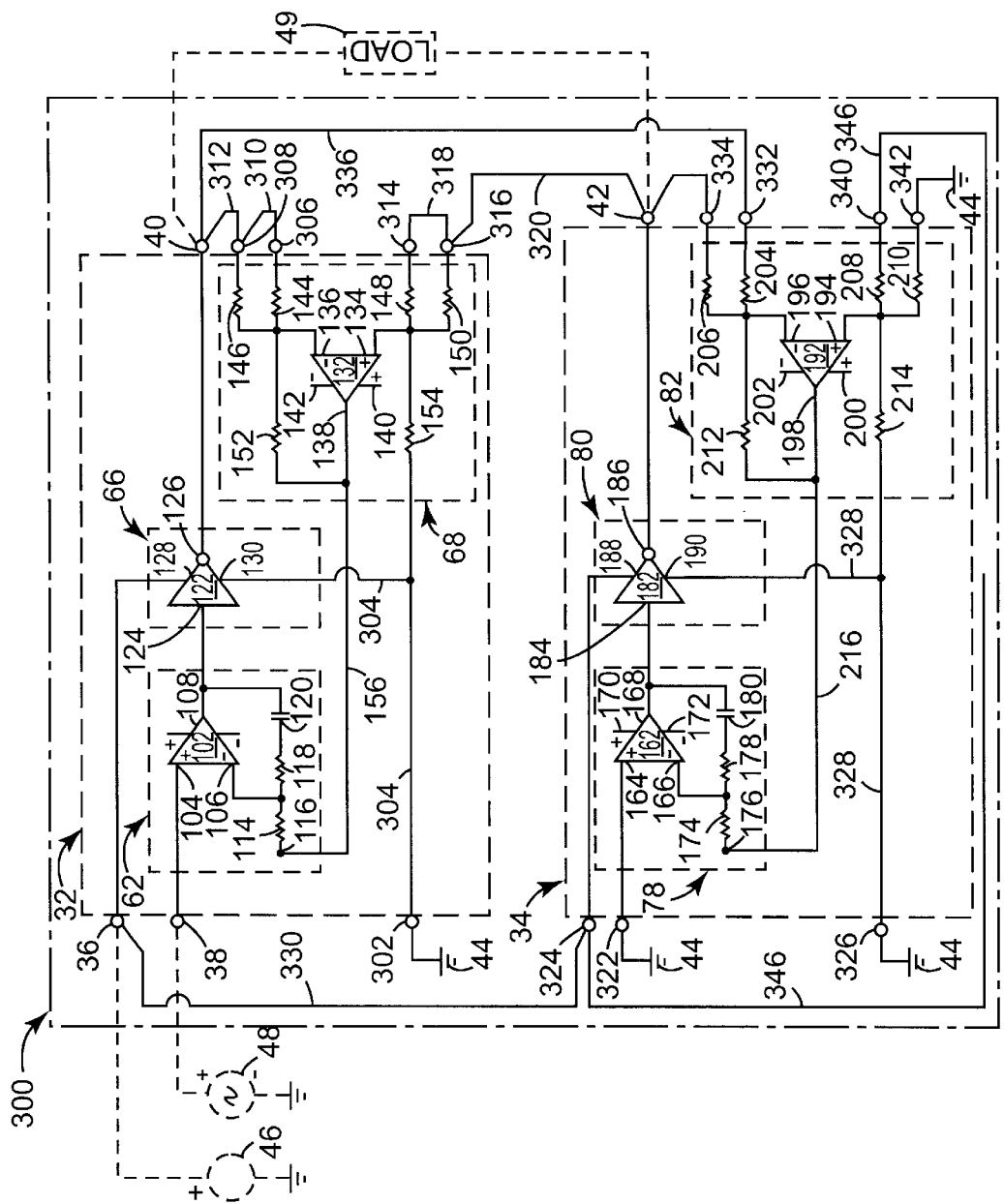
FIG. 4 is a schematic diagram of one embodiment of the precision bridge amplifier of FIG. 3.

One embodiment of a precision bridge amplifier according to the present invention is illustrated schematically at 300 in FIG. 4, and is similar to precision bridge amplifier 100 of FIG. 3, but precision bridge amplifier 300 is specifically implemented with first amplifier module 32 and second amplifier module 34 being substantially identical modules individually encapsulated in plastic and having the free terminals of their component elements coupled to external terminals. Precision bridge amplifier 300 has the same component elements and is functionally configured to operate in substantially the same manner as precision amplifier 100, except that the configuration is achieved via external connections.

First plastic-encapsulated amplifier module 32 comprises error amplifier circuit 62, power amplifier circuit 66, and feedback circuit 68. Error amplifier circuit 62 further includes operational amplifier 102 having non-inverting terminal 104 coupled to second input node 38, inverting terminal 106, output terminal 108, positive voltage terminal 110, and negative voltage terminal 112. Resistor 114 has a first node coupled to inverting terminal 106 and a second terminal 116. Resistor 118 has a first node coupled to inverting terminal 106 and a second terminal, and capacitor 120 is coupled between the resistor 118's second terminal and output terminal 108.

Power amplifier circuit 66 further includes an inverting power amplifier 122 having input terminal 124 coupled to output terminal 108 of operational amplifier 102, output terminal 126 coupled to first output node 40, voltage terminal 128 coupled to first input node 36, and a ground terminal 130 coupled to an external terminal 302 via a line 304. Terminal 302 is coupled to ground 44.

Feedback circuit 68 further includes operational amplifier 132 having non-inverting terminal 134, inverting terminal 136, output terminal 138 coupled to second terminal 116 of resistor 114 via line 156, positive voltage terminal 140, and negative voltage terminal 142. Resistor 144 is coupled between inverting terminal 136 and an external terminal 306, and resistor 146 is coupled between inverting terminal 136 and an external terminal 308. Terminal 306 is coupled to terminal 308 via a line 310, and terminal 308 is coupled to first output node 40 via a line 312. Resistor 148 is coupled between non-inverting terminal 134 and an external terminal 314, and resistor 150 is coupled between non-inverting terminal 134 and an external terminal 316. Terminal 314 is coupled to terminal 316 via a line 318, and terminal 316 is coupled to second output node 42 via a line 320.

Second plastic-encapsulated amplifier module 32 comprises error amplifier circuit 78, power amplifier circuit 80, and feedback circuit 82. Error amplifier circuit 78 further includes operational amplifier 162 having non-inverting terminal 164 coupled to an external terminal 322, inverting terminal 166, output terminal 168, positive voltage terminal 170, and negative voltage terminal 172. Resistor 174 has a first node coupled to inverting terminal 166 and a second terminal 176. Resistor 178 has a first node coupled to inverting terminal 166 and a second terminal, and capacitor 180 is coupled between the resistor 178's second terminal and output terminal 168.

Power amplifier circuit 80 further includes an inverting power amplifier 182 having input terminal 184 coupled to output terminal 168 of operational amplifier 162, output terminal 186 coupled to first output node 40, voltage terminal 188 coupled to an external terminal 324, and ground terminal 190 coupled to an external terminal 326 via a line 328. Terminal 324 is coupled to first input node 36 via a line 330, and terminals 322 and 326 are coupled to ground node 44.

Feedback circuit 82 further includes operational amplifier 192 having non-inverting terminal 194, inverting terminal 196, output terminal 198 coupled to second terminal 176 of resistor 174 via line 216, positive voltage terminal 200, and negative voltage terminal 202. Resistor 204 is coupled between inverting terminal 196 and an external terminal 332, and resistor 206 is coupled between inverting terminal 196 and an external terminal 334. Terminal 332 is coupled to first output node 40 via a line 336, and terminal 334 is coupled to second output node 42 via a line 338. Resistor 208 is coupled between non-inverting terminal 194 and an external terminal 340, and resistor 210 is coupled between non-inverting terminal 194 and an external terminal 342. Terminal 340 is coupled to terminal 324 via a line 346, and terminal 342 is coupled to ground node 44.

Precision bridge amplifier 300 operates identically to precision bridge amplifier 100 to provide the desired output voltage differential across load 49 between output nodes 42 and 40. An advantage of providing the first and second amplifier modules as identical, plastic-encapsulated modules is that only one module is required to be produced and precision bridge amplifier 300 according to present invention can be configured using only external connections, thus resulting in a reduction in inventory and manufacturing costs.

One embodiment of a precision bridge amplifier in accordance with the present invention reduces distortions in the output voltage waveform both by directly sensing the output voltage differential between the single-ended amplifiers and by reducing the gain/offset mismatch between the single-ended amplifiers by utilizing substantially identical circuit for each. Furthermore, one embodiment of a precision bridge amplifier according to the present invention increases the stability of the output voltage waveform by centering the voltage differential within the operating ranges of the amplifiers. Any highly voltage sensitive load requiring a high level of control and consistency in its voltage waveform, such as a piezoelectric transducer used for micro-positioning applications, would benefit from the voltage control characteristics of such a precision bridge amplifier.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing form the scope of the present invention. Those with skill in the chemical, mechanical, electro-mechanical, electrical, and computer arts will readily appreciate that the present invention in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A bridge amplifier comprising:
    a first input node connectable to a power source having an input voltage;
    a second input node connectable to a control source having a control voltage;
    first and second output nodes;
    a first amplifier module having a gain and coupled between the first and second input nodes and between the first and second output nodes, wherein the first amplifier module is configured to compare a voltage differential between the first and second output nodes to the control voltage and provide an output voltage at the first output node necessary to maintain the voltage differential at a level substantially equal to a product of the control voltage multiplied by the gain; and
    a second amplifier module coupled to the first input node and between the first and second output nodes, wherein the second amplifier module is configured to determine a midpoint voltage level of the input voltage and a midpoint level of the voltage differential and provide an output voltage at the second output node necessary to maintain the voltage differential midpoint level at a level substantially equal to the input voltage midpoint level.

2. The bridge amplifier of claim 1, wherein the first amplifier module comprises:
    an error amplifier circuit coupled to the second input node;
    a power amplifier circuit coupled to the first input node, a ground node, and between the error amplifier circuit and the first output node; and
    a feedback circuit coupled to the error amplifier circuit, the ground node, and between the first and second output nodes.

3. The bridge amplifier of claim 2, wherein the error amplifier circuit comprises:
    an operational amplifier having a non-inverting terminal coupled to the second input node, an inverting terminal, a positive voltage terminal, a negative voltage terminal, and an output terminal coupled to the power amplifier circuit;
    a first resistor coupled between the inverting terminal and the feedback circuit;
    a second resistor having a first terminal coupled to the inverting terminal and a second terminal; and
    a capacitor coupled between the output terminal and the second terminal of the second resistor.

4. The bridge amplifier of claim 2, wherein the power amplifier circuit comprises an inverting power amplifier having an input terminal coupled to the error amplifier circuit output terminal, a positive voltage terminal coupled to the first input node, a negative voltage terminal coupled to the ground node, and an output terminal coupled to the first output node.

5. The bridge amplifier of claim 1, wherein the power source comprises a DC power supply.

6. The bridge amplifier of claim 2, wherein the feedback circuit comprises:
    an operational amplifier having a non-inverting terminal, an inverting terminal, a positive voltage terminal, a negative voltage terminal, and an output terminal coupled to the error amplifier circuit;
    a first resistor coupled between the inverting terminal and the first output node;

a second resistor coupled in parallel with the first resistor;

a third resistor coupled between the non-inverting terminal and the second output node;

a fourth resistor coupled in parallel with the third resistor;

a fifth resistor coupled between the inverting terminal and the output terminal; and a sixth resistor coupled between the non-inverting terminal and the ground node.

7. The bridge amplifier of claim 6, wherein the first, second, third and fourth resistors have substantially equal values, and the fifth and sixth resistors have substantially equal values.

8. The bridge amplifier of claim 1, wherein the second amplifier module comprises:

an error amplifier circuit coupled to a ground node;

a power amplifier circuit coupled to the first input node, the ground node, and between the error amplifier circuit and the second output node; and a feedback circuit coupled to the first input node, the error amplifier circuit, the ground node, and between the first and second output nodes.

9. The bridge amplifier of claim 8, wherein the error amplifier circuit comprises:

an operational amplifier having a non-inverting terminal coupled to the ground node, an inverting terminal, a positive voltage terminal, a negative voltage terminal, and an output terminal coupled to the power amplifier circuit;

a first resistor coupled between the inverting terminal and the feedback circuit;

a second resistor having a first terminal coupled to the inverting terminal and having a second terminal; and a capacitor coupled between the output terminal and the second terminal of the second resistor.

10. The bridge amplifier of claim 8, wherein the power amplifier circuit comprises an inverting power amplifier having an input terminal coupled to the error amplifier circuit output terminal, a positive voltage terminal coupled to the first input node, a negative voltage terminal coupled to the ground node, and an output terminal coupled to the second output node.

11. The bridge rectifier of claim 8, wherein the feedback circuit comprises:

an operational amplifier having a non-inverting terminal, an inverting terminal, a positive voltage terminal, a negative voltage terminal, and an output terminal coupled to the error amplifier circuit;

a first resistor coupled between the inverting terminal and the second output node;

a second resistor coupled between the inverting terminal and the first output node and having a value substantially equal to the first resistor;

a third resistor coupled between the non-inverting terminal and the first input node;

a fourth resistor coupled between the non-inverting terminal and the ground node and having a value equal to the third resistor;

a fifth resistor coupled between the inverting terminal and the output terminal; and a sixth resistor coupled between the non-inverting terminal and the ground node.

12. The bridge amplifier of claim 11, wherein the first, second, third and fourth resistors have substantially equal values, and the fifth and sixth resistors have substantially equal values.

13. The bridge amplifier of claim 1, wherein the first and second amplifier modules have passive components having substantially equal values.

14. The bridge amplifier of claim 1, wherein the first and second amplifier modules have active components having substantially equal values.

15. The bridge amplifier of claim 1, wherein the first and second amplifier modules have both active and passive components having substantially equal values.

16. The bridge amplifier of claim 1, wherein the first amplifier module is substantially identical to the second amplifier module.

17. The bridge amplifier of claim 16, wherein the first and second amplifier modules each include external input and external output terminals, wherein the external input and external output terminals of the first amplifier module are coupled into the bridge amplifier differently than the external input and external output terminals of the second amplifier module.

18. The bridge amplifier of claim 17, wherein the first and second amplifier modules are each encapsulated in plastic with access only to the external input terminals and the external output terminals.

19. A method of providing a desired voltage differential between a first node and a second node, the method comprising:

receiving an input voltage with a mid-point voltage level from a power source;

receiving a control voltage from a control source;

providing a voltage differential between the first node and the second node;

comparing the voltage differential between the first and second nodes to the control voltage and providing a voltage at the first node necessary to maintain the voltage differential substantially at a level substantially equal to the desired voltage differential which is substantially equal to the control voltage multiplied by a gain; and comparing a midpoint voltage level of the voltage differential between the first and second nodes to the power source midpoint voltage level and providing a voltage level at the second node necessary to maintain a midpoint voltage level of the voltage differential at a level substantially equal to the power source midpoint voltage level.

20. The method of claim 19, wherein receiving the input voltage includes receiving the input voltage from a DC power supply.

* * * * *